United States Patent
Oh et al.

(10) Patent No.: US 9,735,223 B2
(45) Date of Patent: Aug. 15, 2017

(54) ORGANIC LIGHT-EMITTING DISPLAY APPARATUS AND MANUFACTURING METHOD THEREOF

(71) Applicant: Samsung Display Co., Ltd., Yongin, Gyeonggi-Do (KR)

(72) Inventors: Min-Ho Oh, Yongin (KR); Yoon-Hyeung Cho, Yongin (KR); Yong-Tak Kim, Yongin (KR); So-Young Lee, Yongin (KR); Jong-Woo Kim, Yongin (KR); Ji-Young Moon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 295 days.

(21) Appl. No.: 14/036,430

(22) Filed: Sep. 25, 2013

(65) Prior Publication Data
US 2014/0306195 A1    Oct. 16, 2014

(30) Foreign Application Priority Data
Apr. 12, 2013 (KR) ........................ 10-2013-0040547

(51) Int. Cl.
| | | |
|---|---|---|
| H01L 51/52 | (2006.01) | |
| H01L 51/56 | (2006.01) | |
| H05B 33/04 | (2006.01) | |
| H01L 27/32 | (2006.01) | |
| H01L 51/00 | (2006.01) | |

(52) U.S. Cl.
CPC ...... *H01L 27/3295* (2013.01); *H01L 51/5246* (2013.01); *H01L 51/5253* (2013.01); *H01L 51/56* (2013.01); *H01L 51/0011* (2013.01)

(58) Field of Classification Search
CPC ............. H01L 27/3295; H01L 51/5246; H01L 51/5253; H01L 51/56; H01L 51/0011; H01L 23/3157; H01L 2224/83051
See application file for complete search history.

(56) References Cited

U.S. PATENT DOCUMENTS

| | | | |
|---|---|---|---|
| 5,686,360 A | 11/1997 | Harvey, III et al. | |
| 7,145,290 B2 * | 12/2006 | Kang | .................. H01L 51/5246 313/503 |

(Continued)

FOREIGN PATENT DOCUMENTS

| | | | |
|---|---|---|---|
| JP | WO 2013171966 A1 * | 11/2013 | ......... H01L 51/5246 |
| KR | 100777746 B1 | 11/2007 | |

(Continued)

*Primary Examiner* — Donald Raleigh
(74) *Attorney, Agent, or Firm* — Robert E. Bushnell, Esq.

(57) ABSTRACT

An organic light-emitting display apparatus and a manufacturing method thereof. The organic light-emitting display apparatus includes a substrate, a display unit arranged on the substrate, a dam unit arranged at a periphery of the display unit and on the substrate and an encapsulating layer to encapsulate the display unit, wherein the encapsulating layer includes an organic film covering the display unit, and an inorganic film covering the organic film and the dam unit, and wherein a hardness of the dam unit is lower than that of the inorganic film. According to this, lateral moisture-proof characteristics of the organic light-emitting display apparatus are improved.

19 Claims, 3 Drawing Sheets

(56) References Cited

U.S. PATENT DOCUMENTS

| | | | |
|---|---|---|---|
| 7,667,395 B2* | 2/2010 | Hayashi | H01L 51/5237 257/40 |
| 7,781,967 B2* | 8/2010 | Hayashi | B29C 65/14 313/504 |
| 8,419,494 B2 | 4/2013 | Kwack et al. | |
| 2005/0248270 A1* | 11/2005 | Ghosh | H01L 51/5259 313/512 |
| 2005/0287816 A1* | 12/2005 | Blalock | H01L 21/0276 438/758 |
| 2006/0087229 A1* | 4/2006 | Kim | H01L 51/5246 313/509 |
| 2006/0132030 A1* | 6/2006 | Gao | H01L 51/5237 313/511 |
| 2006/0138928 A1* | 6/2006 | Kim | H01L 51/5253 313/400 |
| 2009/0267508 A1* | 10/2009 | Hasegawa | C08G 73/1082 313/512 |
| 2009/0273589 A1* | 11/2009 | Asano | H01L 27/3246 345/204 |
| 2010/0045181 A1* | 2/2010 | Oh | H01L 33/005 313/512 |
| 2011/0095261 A1* | 4/2011 | Kazlas | B82Y 20/00 257/13 |
| 2012/0133275 A1 | 5/2012 | Lee et al. | |
| 2013/0009544 A1* | 1/2013 | McCutcheon | H01B 3/004 313/509 |
| 2015/0123092 A1* | 5/2015 | Kikuchi | H01L 51/5246 257/40 |

FOREIGN PATENT DOCUMENTS

| | | |
|---|---|---|
| KR | 1020090108498 A | 10/2009 |
| KR | 1020120027992 A | 3/2012 |
| KR | 1020120057286 A | 6/2012 |

\* cited by examiner

ORGANIC LIGHT-EMITTING DISPLAY APPARATUS AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office filed on Apr. 12, 2013 and there duly assigned Serial No. 10-2013-0040547.

BACKGROUND OF THE INVENTION

Field of the Invention

The present invention relates to an organic light-emitting display apparatus and a manufacturing method thereof in which lateral moisture-proof characteristics are improved.

Description of the Related Art

An organic light-emitting display apparatus includes an organic light-emitting device including a hole injection electrode, an electron injection electrode, and an organic light-emitting layer interposed between them. The organic light-emitting display apparatus is a self-emissive display apparatus where holes injected from the hole injection electrode and electrons injected from the electron electrode are combined to create excitons in the organic light-emitting layer, and the excitons decay from an excited state to a ground state to emit a light beam.

Since the organic light-emitting display apparatus, which is a self-emissive display apparatus, does not need separate light sources, low voltage driving and a lightweight and thin type configuration may be possible. The organic light-emitting display apparatus attracts the attention as a next generation display apparatus due to high definition characteristics, such as wide viewing angles, high contrast, and fast response speeds. However, since the organic light-emitting display apparatus is degraded by external moisture or oxygen, it is required to be encapsulated to protect the organic light-emitting device from external moisture or oxygen.

Nowadays, for a thinner and more flexible organic light-emitting display apparatus, a thin film encapsulation (TFE) layer, including organic films and inorganic films, is used to encapsulate the organic light-emitting device.

When the organic films and the inorganic films are formed, patterns are formed by disposing masks corresponding to the films on a substrate. At this time, an organic film may permeate a gap between the mask used to produce the organic film pattern and the substrate. Compared to an inorganic film, the organic film has remarkably lower encapsulation characteristics. Therefore, when an organic film permeates a gap between the substrate and the mask used to pattern the organic film, an organic film may be formed between the inorganic film and the substrate, or between the inorganic films. Also, through this, oxygen or moisture may permeate the display unit.

SUMMARY OF THE INVENTION

The present invention provides an organic light-emitting display apparatus and a manufacturing method thereof in which lateral moisture-proof characteristics thereof are improved.

According to one aspect of the present invention, there is provided an organic light-emitting display apparatus that includes a substrate, a display unit arranged on the substrate, a dam unit arranged at a periphery of the display unit and on the substrate and an encapsulating layer to encapsulate the display unit, wherein the encapsulating layer includes an organic film covering the display unit, and an inorganic film covering the organic film and the dam unit, and wherein the hardness of the dam unit may be lower than that of the inorganic film. The organic film may be spaced apart from the dam unit. The dam unit may include silicon, an epoxy or an acryl. The dam unit may include a plurality of dams spaced apart from each other and parallel to each other. The dam unit may have elasticity. The organic film may include polyurea or polyacrylate. The inorganic film may include $SiN_x$, $Al_2O_3$, $SiO_2$ or $TiO_2$. The display apparatus may also include a lower inorganic film covering the display unit and the dam unit, the organic film may cover the lower inorganic film. The plurality of dams may be concentric rectangles that increase a length of a lateral path of moisture in reaching the display unit from an outside.

According to one aspect of the present invention, there is provided a method of manufacturing an organic light-emitting display apparatus that includes forming a dam unit on a substrate, forming a display unit inside the dam unit and on the substrate and forming an encapsulating layer on the display unit to encapsulate the display unit, the forming of the encapsulating layer may include combining a mask with the substrate, the mask having a groove into which the dam unit is inserted, forming an organic film to cover the display unit by using the mask, separating the mask and forming an inorganic film to cover the organic film and the dam unit. A depth of the groove may be equal to or smaller than a height of the dam unit, and a width of the groove may be equal to or greater than a width of the dam unit. The dam unit may include silicon, an epoxy or an acryl. The dam unit may be produced by inkjet printing or screen printing. The groove may have a tapered shape. When the dam unit is combined to the groove, a shape of the dam unit may change elastically according to a shape of the groove. The organic film may be spaced apart from the dam unit. A hardness of the dam unit may be lower than that of the inorganic film. The method may also include forming a lower inorganic film to cover the display unit and the dam unit, wherein the organic film may be formed to cover a portion of the lower inorganic film, and wherein the combining the mask to the substrate may include inserting the dam unit covered by the lower inorganic film into the groove of the mask.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
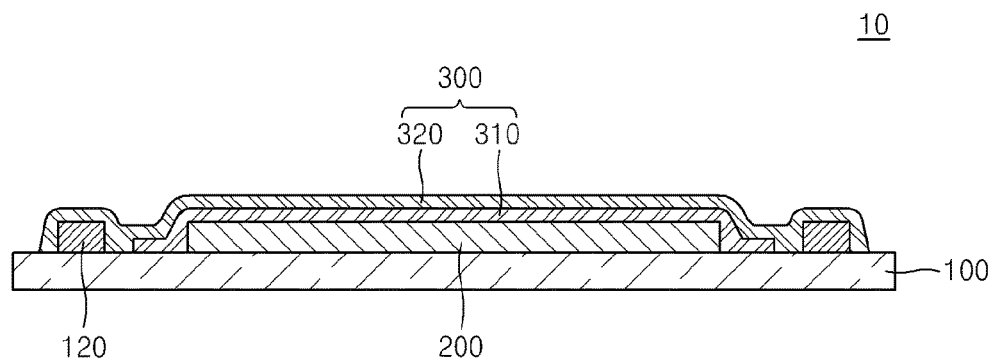
FIG. 1 is a side view schematically illustrating an organic light-emitting display apparatus according to a first embodiment of the present invention.

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. Also, any description that may unnecessarily blur the point of the present invention is omitted from the detailed description.

Also, though terms like "first" and "second" are used to describe various elements and/or portions in various embodiments of the present invention, the members and/or portions are not limited to these terms. These terms are used only to differentiate one member or portion from another one.

It will also be understood that when a portion such as a layer, a film, a region, a plate is referred to as being "on" or "above" another portion, it can be directly on the other portion, or intervening layers may also be present.

Hereinafter, exemplary embodiments of the inventive concept will be described in detail with reference to the accompanying drawings. In the specification, descriptions or drawings on portions irrelative to the present invention will be omitted, or briefly described or drawn Like reference numerals refer to like elements throughout. Also, in the drawings, the thicknesses and areas of layers and regions are enlarged or exaggerated for clarity.

As used herein, the term "and/or" includes any and all combinations of one or more of the associated listed items. Expressions such as "at least one of," when preceding a list of elements, modify the entire list of elements and do not modify the individual elements of the list.

Figure 2:
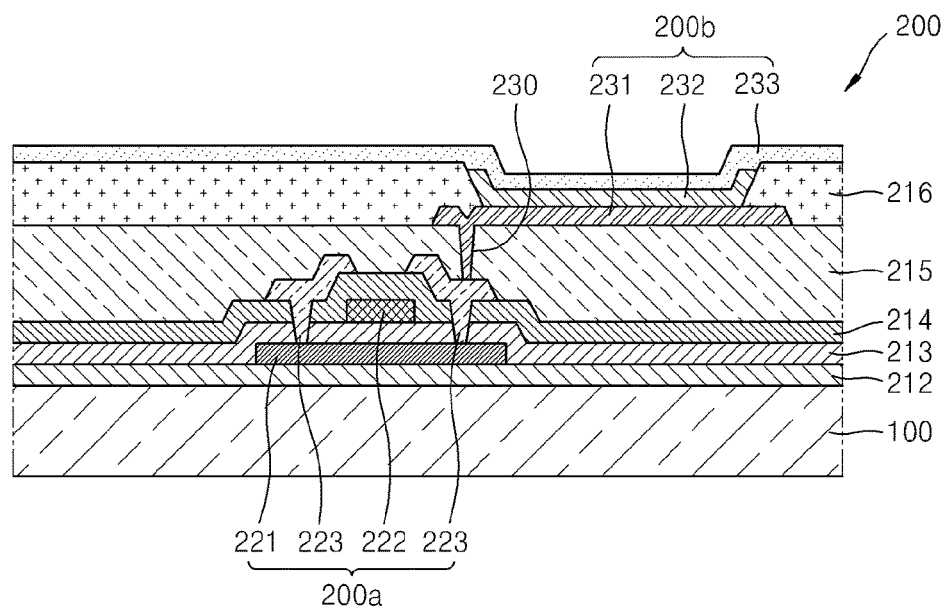
FIG. 2 is an enlarged cross-sectional view illustrating a display unit of the organic light-emitting display apparatus in FIG. 1.
Figure 3:
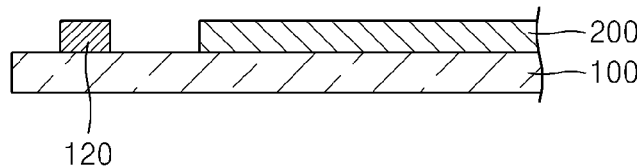
FIG. 3 illustrates a cross-sectional view schematically illustrating a method of manufacturing the organic light-emitting display apparatus where the display unit is formed after the dam unit.

Turning now to FIGS. 1 and 2, FIG. 1 is a side view schematically illustrating an organic light-emitting display apparatus 10 according to the first embodiment of the present invention, and FIG. 2 is an enlarged cross-sectional view illustrating a display unit 200 of the organic light-emitting display apparatus 10 of FIG. 1. Referring to FIGS. 1 and 2, the organic light-emitting display apparatus 10 includes a substrate 100, the display unit 200 formed on the substrate 100, a dam unit 120 spaced-apart from the display unit 200 and on the substrate 100, and an encapsulating layer 300 encapsulating the display unit 200.

The substrate 100 may be a flexible substrate and may be made out of plastic having excellent thermal resistance and durability, such as polyimide, polyethylene terephthalate (PET), polycarbonate, polyethylene naphthalate, polyarylate (PAR), and polyetherimide, however the present invention is not limited thereto, as the substrate 100 may instead be made out of various other materials, such as metal or glass.

The display unit 200 may include an organic thin film transistor (TFT) layer 200a and a pixel unit 200b. The pixel unit 200b may be an organic light-emitting device. Hereinafter, the display unit 200 will be described in detail with reference to FIG. 2.

A buffer layer 212 may be formed on the substrate 100. The buffer layer 212 prevents impurities from permeating through the substrate 100, and provides a flat surface on a top side of the substrate 100. The buffer layer 212 may be made out of various materials capable of performing the above-described functions.

For example, the buffer layer 212 may include an inorganic material, such as silicon oxide, silicon nitride, silicon oxy-nitride, aluminum oxide, aluminum nitride, titanium oxide, or titanium nitride, or an organic material, such as polyimide, polyester, or acrylic. Alternatively, the buffer layer can be a plurality of laminated layers of organic layers and inorganic layers alternately stacked.

A TFT layer 200a may be formed on the buffer layer 212. The TFT layer 200a may include an activation layer 221, a gate electrode 222, and source and drain electrodes 223. Although, as an example of the TFT layer 200a in the present embodiment, a top gate-type TFT is illustrated, a TFT having another structure may also be included.

The activation layer 221 is made out of a semiconductor material and is arranged on the buffer layer 212, and a gate insulating film 213 is formed to cover the activation layer 221. The activation layer 221 may be made out of an inorganic semiconductor, such as amorphous silicon or poly-silicon, or an organic semiconductor, and have a channel region between a source region and a drain region. Also, the gate insulating film 213 insulates the activation layer 221 from the gate electrode 222, and may be made out of an organic material or an inorganic material, such as SiNx or SiO$_2$.

The gate electrode 222 is formed on the gate insulating film 213, and an inter-layer insulating film 214 is formed to cover the gate electrode 222. The gate electrode 222 may include Au, Ag, Cu, Ni, Pt, Pd, Al, or Mo, and an alloy, such as Al:Nd, or Mo:W alloy, but it is not limited thereto as the gate electrode 222 may be made out of various other materials in consideration of design conditions. The inter-layer-insulating film 214 is disposed between the gate electrode 222 and the source and drain electrodes 223 to insulate them from each other, and may be made out of an inorganic material, such as SiNx or SiO$_2$.

The source and drain electrodes 223 are formed on the inter-layer insulating film 214. In detail, the inter-layer insulating film 214 and the gate insulating layer 221 expose the source and drain regions of the activation layer 221, and the source and drain electrodes 223 contact the exposed source and drain regions of the activation layer 221.

FIG. 2 exemplifies a top gate-type TFT, which sequentially includes the activation layer 221, the gate electrode 222, and the source and drain electrodes 223, however the present invention is not limited thereto, and the gate electrode 222 may be disposed below the activation layer 221. The above-described TFT layer 200a is electrically connected to the pixel unit 200b to drive the pixel unit 200b, and is protected by being covered by the planarization layer 215.

The planarization layer 215 may include an inorganic insulating film and/or an organic insulating film. For the inorganic insulating film, $SiO_2$, $SiN_x$, SiON, $Al_2O_3$, $TiO_2$, $Ta_2O_5$, $HfO_2$, $ZrO_2$, BST, or PZT may be used. For the organic insulating film, general purpose polymer (PMMA, PS), polymer derivatives having phenol-based group, acrylic-based polymer, imide-based polymer, aryl ether-based polymer, amide-based polymer, fluorine-based polymer, p-xylene-based polymer, vinyl alcohol-based polymer, and a blend thereof may be used. Also, the planarization layer 215 may be made out of a complex laminated body of inorganic insulating films and organic insulating films.

The pixel unit 200b is formed on the planarization layer 215, and may include a pixel electrode 231, an intermediate layer 232, and an opposite electrode 233. The pixel electrode 231 is formed on the planarization layer 215, and is electrically connected to one of the source and drain electrodes 223 through a contact hole 230 formed in the planarization layer 215. The pixel electrode 231 may be a reflective electrode and may include a reflective film and a transparent or translucent electrode layer formed on the reflective film, wherein the reflective film is made out of Ag, Mg, Al, Pt, Pd, Au, Ni, Nd, Ir, Cr, or a compound thereof while the transparent or translucent electrode layer may be made out of at least one or more of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 that is opposite to the pixel electrode 231 may be a transparent or translucent electrode, and may be made out of a metal thin film having small work function, which includes Li, Ca, LiF/Ca, LiF/Al, Al, Ag, Mg, and a compound thereof. Also, an auxiliary electrode layer or a bus electrode may be further made out of a transparent electrode-forming material, such as ITO, IZO, ZnO, or $In_2O_3$, on the metal thin film.

Accordingly, the opposite electrode 233 may transmit light emitted from an organic light-emitting layer included in the intermediate layer 232. That is, the light emitted from the organic light-emitting layer may be directly output or reflected by the pixel electrode 231 made out of a reflective electrode to be output towards the opposite electrode 233.

However, the organic light-emitting display apparatus 10 according to the present embodiment is not limited to a top-emission type, and may be a bottom-emission type where the light emitted from the organic light-emitting layer is emitted towards the substrate 100. In this case, the pixel electrode 231 may be made out of a transparent or translucent electrode, and the opposite electrode 233 may be made out of a reflective electrode. Also, the organic light-emitting display apparatus 10 according to the present embodiment may be a dual emission type emitting light in both directions of the top and bottom surfaces thereof.

A pixel-defining film 216 is made out of an insulating material and is arranged on the pixel electrode 231. The pixel-defining film 216 exposes a predetermined region of the pixel electrode 231, and the intermediate layer 232 is disposed on the exposed region, wherein the intermediate layer 232 includes an organic light-emitting layer.

The organic light-emitting layer may be made out of a low molecular organic material or a polymer organic material. The intermediate layer 232 may selectively further include, besides the organic light-emitting layer, a functional layer, such as a hole transport layer (HTL), a hole injection layer (HIL), an electron transport layer (ETL), and an electron injection layer (EIL).

Referring now to FIG. 1, the dam unit 120 is formed separately from the display unit 200 on the substrate 100. That is, the dam unit 120 surrounds a periphery of the display unit 200.

Figure 4:
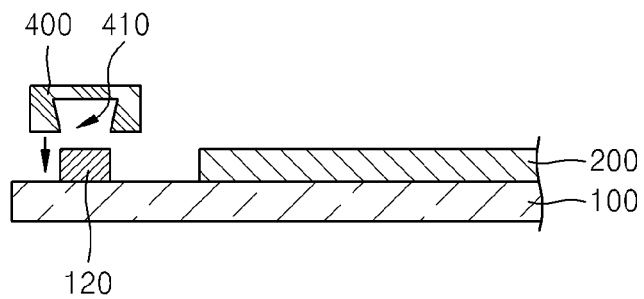
FIG. 4 illustrates a cross-sectional view schematically illustrating a method of manufacturing the organic light-emitting display apparatus where the mask is attached to the dam unit of the display unit.

The dam unit 120, as to be described later, improves the adhesion between the substrate and a mask 400 (see FIG. 4) used to pattern the organic film 310 of the encapsulating layer 300 to effectively prevent a monomer of material used to form the organic film 310 from permeating a gap between the substrate 100 and the mask 400 in FIG. 4 during formation of the organic film 310. By preventing the organic film 310 from being exposed to the outside, the lateral water vapor resistance of the organic light-emitting display apparatus 10 is improved.

The dam unit 120 is an elastic member made out of any one of silicon, an epoxy, and an acryl. Accordingly, when combined with the mask 400 in FIG. 4, the dam unit 120 can change its shape according to a shape of a groove 410 formed in the mask 400, as shown in FIG. 4, and may then return to its original shape after the mask 400 in FIG. 4 is removed.

Since the dam unit 120 exists on a periphery of the display unit 200, a permeation path of moisture or oxygen permeating the display unit 200 from an external portion of the organic light-emitting display apparatus 10 may be lengthened. Accordingly, the water vapor resistance of the organic light-emitting display apparatus 10 can be further improved. In order to further increase water vapor resistance and although not shown in the drawings, the dam unit 120 may include a plurality of dams separated from each other to allow a permeation path of moisture or oxygen to be further lengthened.

The encapsulating layer 300 encapsulates the display unit 200 to prevent degradation of the display unit 200. FIG. 1 exemplifies the encapsulating layer 300 including a single organic film 310 and a single inorganic film 320, but the present invention is not limited thereto. The organic film 310 and the inorganic film 320 may instead be alternately laminated a plurality of times.

The organic film 310 is formed to cover the display unit 200, and may be spaced-apart from the dam unit 120. The organic film 310 is made out of an organic material having flexibility, such as polyurea, or polyacrylate to relax the internal stress of the inorganic film 320, or increase the effect of preventing external moisture or oxygen permeation by filling minute cracks and pinholes of the inorganic film 320. The inorganic film 320 may be made out of an inorganic material having an excellent moisture-proof capability, such as $SiN_x$, $Al_2O_3$, $SiO_2$, or $TiO_2$, in order to prevent external moisture or oxygen permeation. Accordingly, the inorganic film 320 is formed to cover the organic film 310. Also, the inorganic film 320 is formed to cover the dam unit 120.

Figure 7:
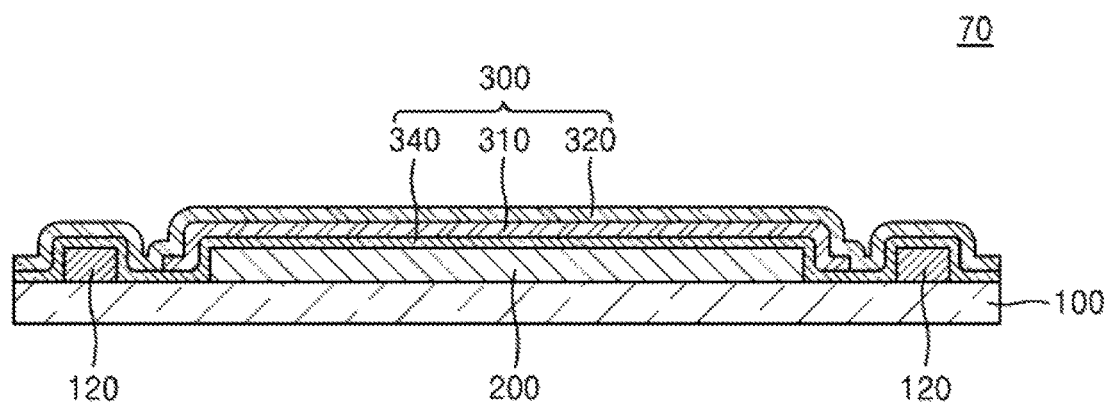
FIG. 7 is a side view schematically illustrating an organic light-emitting display apparatus according to a second embodiment of the present invention.

According to another embodiment as per the organic light-emitting display apparatus 70 illustrated in FIG. 7, a lower inorganic film 340 is first formed on each of substrate 100, display unit 200 and dam unit 120, and then the organic film 310 and an upper inorganic film 320 may then be sequentially formed on top of the lower inorganic film 340. In this case, the dam unit 120 and the substrate 100 are covered by the lower inorganic film 340 in addition to the upper inorganic film 320.

Turning now to FIGS. 3 to 6, FIGS. 3 to 6 are cross-sectional views schematically illustrating a method of manufacturing the organic light-emitting display apparatus 10 in FIG. 1, according to the second embodiment of the present invention. First, referring to FIG. 3, the dam unit 120 is formed on the substrate 100, and then the display unit 200 is formed inside the dam unit 120.

The dam unit 120 may be produced by an inkjet printing or a screen printing technique. The inkjet printing is performed by printing ink containing a material of silicon, an epoxy, or an acryl on a corresponding portion to form the dam unit 120. The screen printing is performed by positioning a mask (not shown) having openings in correspondence to a position at which a dam unit is to be formed on the substrate 100, and then moving a squeeze rubber (not shown) in one direction and passing a paste containing silicon, an epoxy, or an acryl through the openings to form the dam unit 120. Although the dam unit 120 may be produced by an inkjet printing or a screen printing technique, the present invention is not limited thereto as the dam unit 120 may instead be produced by a coating method, such as spin coating or depositing, and then performing a photo etching process.

After the dam unit 120 is formed, the display unit 200 is formed. The display unit 200 is formed inside the dam unit 120 to be separated from the dam unit 120. The display unit 200 may not only have the configuration exemplified in FIG. 2, but may also employ any well-known organic light-emitting display. Accordingly, a detailed description of its manufacturing method is omitted.

Figure 5:
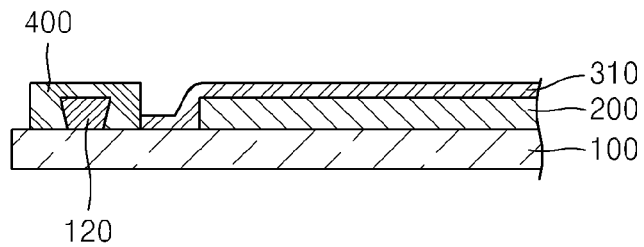
FIG. 5 illustrates a cross-sectional view schematically illustrating a method of manufacturing the organic light-emitting display apparatus where an organic unit is formed on the display.

Next, the encapsulating layer 300 is formed to encapsulate the display unit 200. First, as shown in FIG. 4, the mask 400 is attached to the substrate 100, and then, as shown in FIG. 5, the organic film 310 is formed to cover the display unit 200 by using the mask 400.

The groove 410 having the dam unit 120 inserted into it is formed in the mask 400. Here, the depth of the groove 410 may be equal to or smaller than the height of the dam unit 120, and the width of the groove 410 may be equal to or greater than the width of the dam unit 120. Here, the width of the groove 410 is measured on the same plane as one surface of the mask 400 abutting on the substrate 100, namely, a width of a portion into which the dam unit 120 begins to be inserted. As described above, when the width of the groove 410 is equal to or greater than the width of the dam unit 120, the dam unit 120 may be easily inserted into the groove 410, even when an error occurs in a mask aligning process.

In addition, since the dam unit 120 has elasticity, the size and shape of the dam unit 120 can elastically varies according to a shape of the groove 410 when combined with the groove 410. Accordingly, since the depth of the groove 410 is equal to or smaller than the height of the dam unit 120, the dam unit 120 ends up abutting both sides of the groove 410, the result being that the mask 400 adheres to the substrate 100.

The groove 410 may have a tapered shape with a lower portion having a width greater than an upper portion, the upper portion corresponding to the opening of the groove 410. Due to this, the coherence between the dam unit 120 and the groove 410 is improved.

The organic film 310 is formed when the mask 400 is combined with the substrate 100. Since it is difficult to directly deposit a polymer, such as polyurea or polyacrylate, which is a material of the organic film 310, the organic film 310 may be formed by evaporating a liquefied monomer for deposition onto the substrate 100, and emitting ultraviolet rays onto the deposited monomer for polymerization.

At this time, since the evaporated monomer is non-directional, if there is a gap between the mask 400 and the substrate 100, the evaporated monomer may permeate the gap. However, due to combination of the groove 410 and the dam unit 120 according to the present invention, the mask 400 of FIG. 5 may strongly adhere to the substrate 100, and permeation of the evaporated monomer into the gap may be minimized. Accordingly, the formation of a general edge tail is prevented, and the organic film 310 may be formed to be separated from and spaced apart from the dam unit 120.

Even though there is a gap between the mask 400 and the substrate 100, and the evaporated monomer permeates the gap, the dam unit 120 may block the evaporated monomer from spreading to the periphery.

Figure 6:
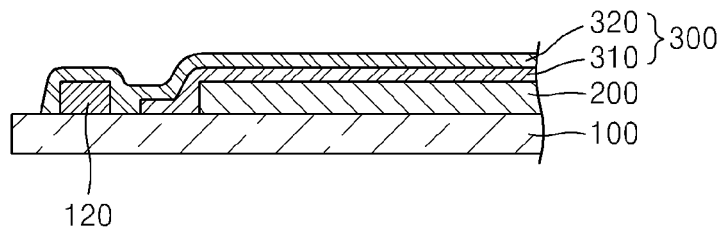
FIG. 6 illustrates a cross-sectional view schematically illustrating a method of manufacturing the organic light-emitting display apparatus where the inorganic film is formed.

Next, as shown in FIG. 6, the mask 400 in FIG. 5 is separated from the dam unit 120 of the substrate 100, and then the inorganic film 320 is formed. The inorganic film 320 may be formed through sputtering, atomic layer deposition, or chemical vapor deposition by using a mask (not shown) for forming the inorganic film 320.

The inorganic film 320 is formed to cover the organic film 310 and the dam unit 120. Since the inorganic film 320 is formed to cover the organic film 310, the periphery of the organic film 310 is covered by the inorganic film 320 that has excellent moisture-proof properties, and the organic film 310, which is flexible but vulnerable to moisture, is not exposed to the outside. Therefore the encapsulating layer 300 having a very stable water vapor resistance may be realized.

In the above description of FIGS. 1 to 6, it is exemplified that the encapsulating layer 300 includes the single organic film 310 and the single inorganic film 320, however, the present invention is not limited thereto, as the encapsulating layer 300 may instead include a plurality of the organic films 310 and a plurality of inorganic film 320 alternately laminated. Also, in the second embodiment of FIG. 7, the encapsulating layer 300 of the organic light-emitting apparatus 70 may instead include a lower inorganic film 340 being first formed, and an organic film 310 and an upper inorganic film 320 being sequentially formed on the lower inorganic film 340 and still be within the scope of the present invention. In the second embodiment of FIG. 7, the dam unit 120 is formed on the substrate 100 and is covered by the lower inorganic, film 340 as well as the upper inorganic film 320.

According to the embodiments of the present invention, lateral moisture-proof characteristics of an organic light-emitting display apparatus can be improved by preventing an organic film from permeating a gap between a mask and a substrate during formation of the organic film.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus, comprising:
    a substrate;
    a display unit arranged on the substrate;
    a dam unit arranged at a periphery of the display unit and on the substrate;
    a lower inorganic film covering the display unit and the dam unit; and
    an encapsulating layer to encapsulate the display unit,
    wherein the encapsulating layer includes an organic film covering a portion of the lower inorganic film, and an upper inorganic film covering the organic film and the dam unit, the organic film covers an entirety of the display unit, wherein a hardness of the dam unit is lower than that of the upper inorganic film, and wherein the dam unit is arranged at a periphery of the organic film, the substrate being a flexible substrate.

2. The organic light-emitting display apparatus of claim 1, wherein the organic film is spaced apart from the dam unit, does not overlap the dam unit and is spaced-apart from the display unit by only the lower inorganic film.

3. The organic light-emitting display apparatus of claim 1, wherein the dam unit comprises a material selected from a group consisting of silicon, an epoxy and an acryl, wherein the dam unit has elasticity and can change its shape according to a shape of a groove of a mask that attaches to the dam unit.

4. The organic light-emitting display apparatus of claim 1, wherein the upper inorganic film comprises a material selected from a group consisting of $SiN_x$, $Al_2O_3$, $SiO_2$, and $TiO_2$, the upper inorganic film being vacuum deposited and having a non-planar upper surface.

5. The organic light-emitting display apparatus of claim 1, wherein the organic film and the dam unit do not overlap.

6. The organic light-emitting display apparatus of claim 1, the lower inorganic film covering an entirety of opposing sidewalls of the dam unit.

7. A method of manufacturing an organic light-emitting display apparatus, comprising:
   forming a dam unit on a substrate;
   forming a display unit inside the dam unit and on the substrate; and
   forming an encapsulating layer on the display unit to encapsulate the display unit, wherein the forming of the encapsulating layer includes:
      combining a mask with the substrate, the mask having a groove into which the dam unit is inserted;
      forming an organic film to cover the display unit by using the mask;
      separating the mask; and
      forming an inorganic film to cover the organic film and the dam unit.

8. The method of claim 7, wherein a depth of the groove is equal to or smaller than a height of the dam unit, and a width of the groove is equal to or greater than a width of the dam unit.

9. The method of claim 7, wherein the dam unit comprises a material selected from a group consisting of silicon, an epoxy and an acryl.

10. The method of claim 7, wherein the dam unit is produced by a technique selected from a group consisting of an inkjet printing technique and a screen printing technique.

11. The method of claim 8, wherein the groove has a tapered shape.

12. The method of claim 11, wherein when the dam unit is combined to the groove, a shape of the dam unit changes elastically according to a shape of the groove.

13. The method of claim 7, wherein the organic film is spaced apart from the dam unit.

14. The method of claim 7, wherein a hardness of the dam unit is lower than that of the inorganic film.

15. The method of claim 7, further comprising forming a lower inorganic film to cover the display unit and the dam unit, wherein the organic film is formed to cover a portion of the lower inorganic film, and wherein the combining the mask to the substrate includes inserting the dam unit covered by the lower inorganic film into the groove of the mask.

16. The method of claim 7, wherein the organic film comprises a material selected from a group consisting of polyurea and polyacrylate, the organic film being produced by evaporating a liquefied monomer that is non-directional.

17. An organic light-emitting display apparatus, comprising:
   a substrate;
   a display unit arranged on the substrate;
   a dam unit arranged at a periphery of the display unit and on the substrate;
   a lower inorganic film covering the display unit and the dam unit; and
   an encapsulating layer to encapsulate the display unit, wherein the encapsulating layer includes an organic film covering a portion of the lower inorganic film, and an upper inorganic film covering the organic film and the dam unit, the organic film entirely covering the display unit,
   wherein a hardness of the dam unit is lower than that of the upper inorganic film, and
   wherein the dam unit is arranged at a periphery of the organic film.

18. The organic light emitting display device of claim 17, wherein an upper surface of the upper inorganic film that faces away from the substrate is non-planar due to the underlying display unit and the dam unit, wherein a distance from the substrate to upper inorganic film in a direction normal to an upper surface of the substrate varies with location.

19. The organic light emitting display device of claim 17, the organic film comprising at least one of polyuria and polyacrylate to relax an internal stress of the upper inorganic film, the organic film preventing external moisture and oxygen from reaching the display unit by filling minute pinholes and cracks in the upper organic film.

* * * * *